United States Patent
Ekberg et al.

(10) Patent No.: US 6,844,123 B1
(45) Date of Patent: Jan. 18, 2005

(54) SYSTEM FOR PRODUCTION OF LARGE AREA DISPLAY PANELS WITH IMPROVED PRECISION

(75) Inventors: Peter Ekberg, Lindingo (SE); Johan Åman, Täby (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 09/869,119

(22) PCT Filed: Jan. 18, 2000

(86) PCT No.: PCT/SE00/00097

§ 371 (c)(1),
(2), (4) Date: Sep. 14, 2001

(87) PCT Pub. No.: WO00/42630

PCT Pub. Date: Jul. 20, 2000

(30) Foreign Application Priority Data

Jan. 18, 1999 (SE) .............................................. 9900114

(51) Int. Cl.$^7$ .............................. G03F 9/00; G03C 5/00; G03B 27/00
(52) U.S. Cl. ............................. 430/30; 430/320; 355/18
(58) Field of Search .................................. 430/311, 396, 430/320, 321, 5, 22, 30; 355/18; 716/19

(56) References Cited

U.S. PATENT DOCUMENTS 5,815,685 A     9/1998    Kamon

FOREIGN PATENT DOCUMENTS

EP          0467076         1/1992
WO          97/05526        2/1997

*Primary Examiner*—Saleha R. Mohamedulla
(74) *Attorney, Agent, or Firm*—Harness, Dickey & Pierce, P.L.C.

(57) ABSTRACT

The present invention relates to a method and a system for producing large area display panels with improved precision. The system according to the invention comprises a first mask producing means (1) for producing a mask with a predetermined pattern according to input data and microlithographic exposing means (2) for exposing a photosensitive substrate with light and with use of a mask to impose the pattern of the mask on the substrate, whereby said substrate has a layer being sensitive to said light. Further, the system comprises measuring means (3) for measuring the pattern on the substrate and detecting deviations relative to the intended pattern as given by the input data, and second mask producing means (1) for producing a second mask according to second input data, and being controllable according to said measurement, to modify the pattern on the mask to compensate for the measured deviations, and thus compensate for production distortions.

22 Claims, 2 Drawing Sheets

Fig 1 - Prior art

SYSTEM FOR PRODUCTION OF LARGE AREA DISPLAY PANELS WITH IMPROVED PRECISION

This application is the national phase under 35 U.S.C. § 371 of PCT International Application No. PCT/SE00/00097 which has an International filing date of Jan. 18, 2000, which designated the United States of America and was published in English.

FIELD OF THE INVENTION

The present invention relates to a method and a system for producing large area display panels with improved precision.

BACKGROUND OF THE INVENTION

It is known beforehand in the art to produce large area display panels. This is typically accomplished by first producing a mask according to input data, and subsequently to use said mask in a microlithographic exposing device to produce panels with said pattern. The precision for the panels are of utmost importance, and much effort is taken to improve the precision in the pattern production as well as in the exposure of the panels. E.g. the laser writers often used for mask production comprises compensation means to compensate for scale errors, orthogonality errors, stage bows, local offset errors etc.

However, there are still significant precision errors, because of different conditions and surroundings for the different production devices, systematic errors, errors caused by the processing of the plate, such as the development, etching, blasting and high temperature processing steps. Further, large area display panels are extremely sensitive for errors, while even very small deviations from the intended pattern may be visible. These errors make the production costly and tedious, and give rise to a large number of rejected defect panels.

SUMMARY OF THE INVENTION

It is therefore an object of the present invention to provide a method and a system for producing large area display panels with improved precision.

This object is achieved with a method and a system according to the appended claims.

BRIEF DESCRIPTION OF THE DRAWINGS

For exemplifying purposes, the invention will be described in closer detail in the following with reference to embodiments thereof illustrated in the attached drawings, wherein.

DESCRIPTION OF PREFERRED EMBODIMENTS

Figure 2:
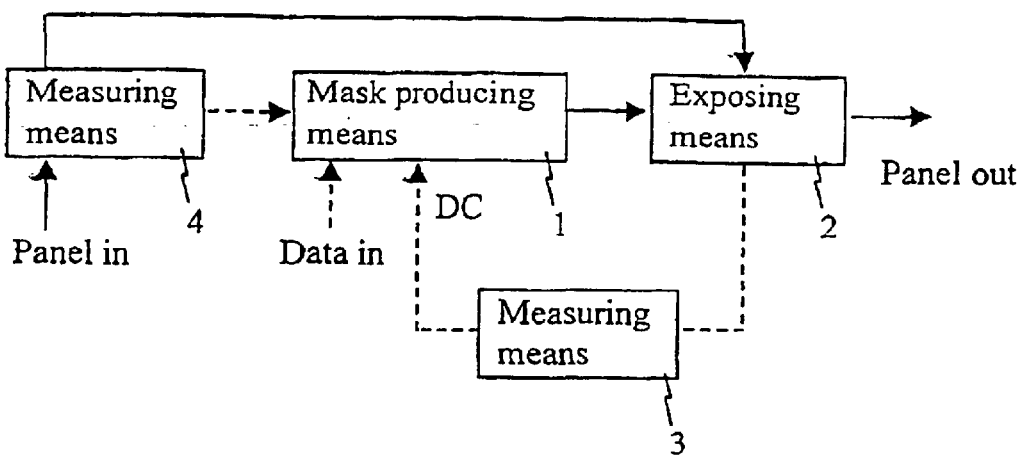
FIG. 2 is a schematic view of a system according to one embodiment of the invention.
Figure 3:
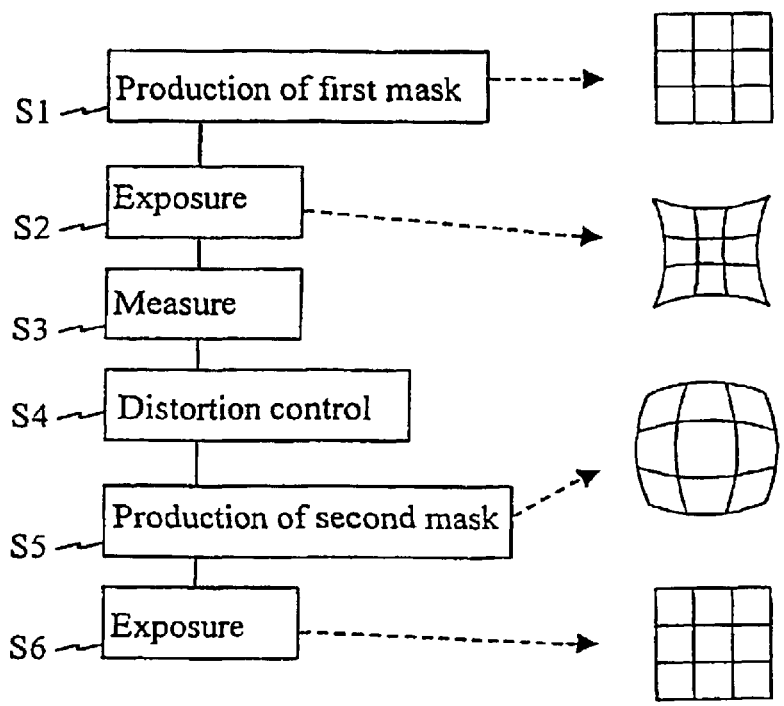
FIG. 3 is a schematic flow chart of a method according to one embodiment of the invention.

Referring to FIG. 2, a first embodiment of the system for producing large area display panels according to the invention. The system could be used for producing shadow masks for conventional CRT (Cathode Ray Tube) displays, but is especially useful for producing TFT (Thin Film Transistor), CF (Color Filter), PDP (Plasma Display Panel) or PALC (Plasma-addressed liquid crystal) displays.

Figure 1:
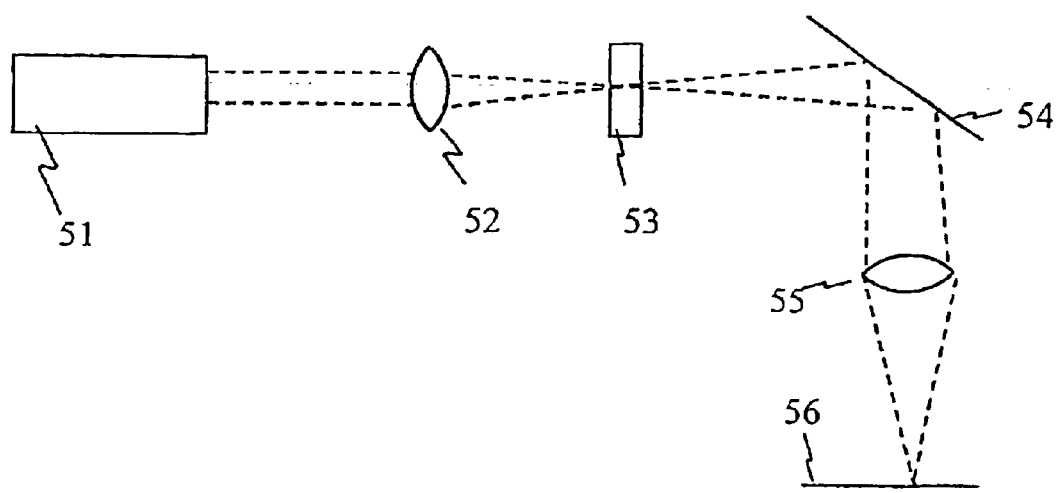
FIG. 1 is a mask producing apparatus according to the prior art.

The system comprises a first mask producing means 1 for producing a mask with a predetermined pattern according to input data. The mask producing means is preferably a microlithographic writing device for writing with high precision on photosensitive substrates. The term writing should be understood in a broad sense, meaning exposure of photoresist and photographic emulsion, but also the action of light on other light sensitive media such as dry-process paper, by ablation or chemical processes activated by light or heat. Light is not limited to mean visible light, but a wide range of wavelengths from infrared to extreme UV. Such a mask producing apparatus is previously known from e.g. EP 0 467 076 by the same applicant. In general the apparatus comprises, as is shown in FIG. 1, a light source 51, such as a laser, a first lens 52 to contract the light beams, a modulator 53 to produce the desired pattern to be written, the modulator being controlled according to input data, a reflecting mirror 54 to direct the beams towards the substrate 56, and a lens 55 to contract the beams before it reaches the substrate. The mirror 54 is used for the scanning operation to sweep the beam along scan lines on the substrate. Instead of a mirror, other scanning means may be used, such as a rotating polygon, rotating prism, rotating hologram, an acousto-optic deflector, an electro-optic deflector, a galvanometer or any similar device. It is also possible to use raster scanning or spatial light modulators. Further, the substrate is preferably arranged on an object table which has a motion in two orthogonal directions relative to the optical writing system, by means of two electrical servo motors.

The system according to the invention further comprises microlithographic exposing means 2 for exposing a photosensitive panel substrate with light and with use of the mask to impose the pattern of the mask on the substrate, whereby said substrate has a layer being sensitive to said light. Several such exposing means are also previously known in the art. The exposing means could be of the contact copy type, proximity exposure type, or a projection aligner: The system according to the invention could also be used in a direct writer, whereby the compensation is not made in a physical mask, but in a data mapping controlling the writing beam. For TFT and CF display panels projection aligners are usually used, and for PDP and PALC the contact or proximity type are frequently used.

Furthermore, the system comprises measuring means 3 for measuring the pattern on the substrate and detecting deviations relative to the intended pattern as given by the input data. This could be done by measuring the geometrical position of the pattern, preferably at some reference positions, to get a so called registration mapping, and compare it with the intended pattern which is deducible from the input data. Further, the width of lines in the pattern, the so called CD (Critical dimension), could be measured. Measuring equipment is commercially available, and for example the equipment could comprise a CCD-camera or be based on interferometry.

From the measuring means 3 a distortion control signal is sent to a second mask producing means 4. This second mask producing means could be a separate apparatus, but is preferably the same as the first mask producing means 1. This second mask producing means is fed with input data describing the intended mask pattern to be written, and is also fed with the distortion control signal from the measuring means 3, whereby the writing process for producing the second mask is controlled to modify the pattern to compensate for the measured deviations, and thus compensate for production distortions. The measurement is preferably made after the subsequent processing steps of the panel as well, i.e. the development, blasting and/or etching, whereby systematic errors from theses processes are taken care of in the compensation as well.

The compensation in the mask writer could be accomplished in different ways. In a writer of the type described above, with an object table continuously moving in a slow strip direction and a scanner sweeping in a fast scanning direction, the compensation could be made according to a surface mapping. According to this mapping the compensation in the scanning direction could be accomplished by e.g. offsetting the starting time of the beam during the scanning. In the stripe direction the compensation could also be made by time offsets, either directly or indirectly by means of different ramp functions. There are also other possible way to accomplish such compensation. For example the compensation could be made by controlling the servo motors for the object table, by adjustment of the time dependent angle of the scanners, by changing the input data or by controlling an internal control unit such as piezoelectrically controlled mirrors.

However, if a direct writer is used, the same type of compensation could be made in real time.

Compensation for deviations in the line width, CD, could be accomplished in the same way as deviations in the registration. However, this compensation could also be made by changes in the power of the writing beam, i.e. the exposing dose, by changing the laser output or having an analog modulator. This compensation could be accomplished by means of a herefore adapted dose mapping to control the dose.

When the second mask is used in the same exposing means 2 all systematic errors depending on different temperature conditions, errors in the exposing means etc., are compensated for, and the pattern precision of the produced display panels are greatly improved.

The first mask could either contain the same pattern as the intended pattern for the second mask, i.e. the pattern not being compensated, or contain a reference pattern, intended for deviation measure only.

Further, error data could be accumulated, and a rolling means value could be used for the compensation. The error compensation could also be a combination of several different part error compensations. Those part compensations could be based on the premises for the process, e.g. which stepper and type of glass that is being used. Hereby the total error compensation could be a combination of one or several error compensations for each process step.

Above, a system for passive distortion control has been described. In this system compensation is made for the processes and equipment being used in the system. However, the compensation is not adapted for different panel substrates. In this passive system a measurement to alter the distortion compensation is preferably made once for every new batch of substrates, and thereafter the same mask is used for producing all the panels in the batch. This passive distortion control is specifically useful for production of TFT or CF displays. The requested precision for the patterns on the mask for this production is extremely high, and the masks are very difficult, and thereby expensive, to manufacture. On the other hand the masks last for a long time in this production.

The system according to the invention could also comprise second measuring means 4 for measuring the thickness of the light sensitive layer on the substrate prior to the exposure, whereby said measurement is also used for said compensation. Hereby the compensation is adapted for varying resist layers between different batches of substrates. Such batch wise compensation could also be accomplished with use of data specified by the manufacturer.

This second measuring means 4 could also be used for measuring each and every panel substrate that is going to be exposed, and thereafter adapt the process for each individual panel. Hereby the system could compensate for varying glass quality in different panels, varying thickness and quality of the resist or emulsion of the substrate area, different form variations etc. This active distortion control is especially useful for production of PDP or PALC display panels, where the masks are comparably easy and inexpensive to produce. This method could also be used for direct writers.

In the active distortion control the panel is initially measured, regarding e.g. resist thickness. Many such measuring methods are available for someone skilled in the art, e.g. a test exposure, dosimetry, of the substrate with different doses, by profilometry, interferometry, confocal microscopy, by an interferometric method or the like. The shape of the substrate could also be initially measured, and this could be accomplished by known methods such as moiré interferometry, projected fringes, laser triangulation, ordinary interferometry etc. Preferably already existing patterns are also initially measured, whereas such exists. Display panels are usually exposed in several separate steps, typically 3–7 exposing steps, and normally the same exposing station is used for all the exposures. By writing masks with compensation for individual errors in different station the display producer could schedule the production more freely, independent of which stations that is used. This is of great importance for making the production more efficient and the utilization of the stations better.

Referring now to FIG. 2, a method for producing large area display panels according to the invention, and with use of the above-mentioned system will be described.

The method according to the invention comprises a first step S1 in which a mask with a predetermined pattern according to input data is produced. Thereafter the mask is used for microlithographically exposing a photosensitive substrate with light to impose the pattern of the mask on the substrate, whereby said substrate has a layer being sensitive to said light, in step S2. The exposed pattern is then measured, possibly after several subsequent processing steps, or even in the finished product, in S3, to detect deviations of the exposed pattern relative to the intended pattern as given by the input data. In step S4 a distortion control mapping is then produced, to be used in step S5 during production of a second mask having a pattern according to input data and modified to diminish the measured deviations, and thus to compensate for production distortions. In the last step S6 the second modified mask is then used in a photolithographic fabrication of display panels. Similar compensation may be used in a direct writer, where the compensation could be made in a data mapping.

Further, the present invention relates to a large-area pattern generator, for producing e.g. masks for producing large-area display panels such as is described above. The large-area pattern generator according to the invention comprises an exposing system for exposing a substrate with radiant energy and according to input pattern data to impose a predetermined pattern on the substrate, whereby said substrate has a layer being sensitive to said radiant energy, as is previously described. It further comprises a geometry-correcting system for correcting the pattern being imposed in the substrate according to digital distortion data, comprising effectuators for controlling at least one of the feeding of input pattern data in the data path, the movement of the substrate or the pattern placement on the substrate, as is likewise described in the foregoing.

The invention has above been described with reference to a microlithography system, where photons (light) is used as the radiant energy. However, other types of radiant energy may be used as well, such as charged particles, electrons, ions, EUV (Extreme Ultra Violet), and other radiant energies suitable for substrate exposure. Further, other types of pattern generator may be used. For example, the pattern generator may use an acousto-optic modulator to control the radiant energy according to input data, as well as a voltage controlled modulator or an SLM (Spatial Light Modulator). If an SLM is used, the pattern generator may either be of the type using raster scanning or the type using shaped beams.

The invention makes the production of large area display panels more efficient and cost effective, at the same time as the pattern precision is improved. However several variations of the above-mentioned embodiments are possible, and obvious for a person skilled in the art. Such obvious modifications must be considered as being part of the invention, as it is defined by the following claims.

What is claimed is:

1. A method for producing large area display panels comprising the steps of:
   producing a mask with a predetermined pattern according to input data;
   exposing a substrate with a radiant energy and with use of the mask to impose the pattern of the mask on the substrate, whereby said substrate has a layer being sensitive to said radiant energy;
   measuring the pattern on the substrate and detecting deviations, and at least position errors, relative to the intended pattern as given by the input data;
   producing a second mask with a pattern according to second input data and modified to diminish the measured deviations, and at least said measured and detected position errors, and thus compensate for production distortions;
   using said modified mask in a subsequent fabrication of large area display panels.

2. A method according to claim 1, whereby the radiant energy is light, used for microlithographically exposing a photosensitive substrate.

3. A method according to claim 1, whereby the measuring is made after processing steps, such as development, etching, blasting or high-temperature processing, following the exposure.

4. A method according to claim 1, whereby the first and the second mask are based on the same input data.

5. A method according to claim 1, whereby the first mask is a reference mask based on reference input data, whereas the second mask is based on actual product data.

6. A method according to claim 1, whereby the compensation used is a statistical mean value of the compensation according to the measurement and compensation according to prior measurements.

7. A method according to claim 1, wherein at least one additional measurement is made during the process, whereby the compensations is a statistical mean value of compensation parts related to the process before the first measurement, and the process between the measurements.

8. A method according to claim 1, whereby the thickness of the sensitive layer before the exposure on the mask blank or on the substrate is measured, whereby said measurement data are used for additional compensation.

9. A method according to claim 1, whereby already existing patterns on the substrate is measured prior to the exposure, whereby said measurement is used for additional compensation.

10. A method according to claim 1, whereby said method is performed once for each substrate batch used in said fabrication.

11. A method according to claim 1, whereby the measurement comprises measurement of position errors and pattern line width errors.

12. A method according to claim 1, whereby said compensation is performed by time offsets or room offsets in the pattern writer used for producing the second mask.

13. A system for producing large area display panels comprising:
   a first mask generator for producing a mask with a predetermined pattern according to input data;
   an exposing means for exposing a substrate with radiant energy and with use of a mask to impose the pattern of the mask on the substrate, whereby said substrate has a layer being sensitive to said radiant energy;
   a measuring device for measuring the pattern on the substrate and detecting deviations, and at least position errors, relative to the intended pattern as given by the input data;
   a second mask generator for producing a second mask according to second input data, and being controllable according to said measurement, to modify the pattern on the mask to compensate for the measured deviations, and at least said measured and detected position errors, and thus compensate for production distortions.

14. A; system according to claim 13, whereby the radiant energy is light, for microlithographically exposing a photosensitive substrate.

15. A system according to claim 13, comprising at least one additional measuring device, whereby the compensations is a statistical mean value of compensation parts related to the process before the first measurement, and the process between the measurements.

16. A system according to claim 13, whereby the first and the second mask generator are the same device.

17. A system according to claim 13, further comprising a second measuring device for measuring the thickness of the light sensitive layer on the substrate prior to the exposure, whereby said measurement is used for additional compensation.

18. A system according to claim 13, further comprising a third measuring device for measuring of existing patterns on the substrate prior to the exposure, whereby said measurement is used for additional compensation.

19. A system according to claim 13, whereby the first measuring device comprises means for measurement of position errors and pattern line width errors.

20. A system according to claim 13, whereby said mask generator comprises a pattern writer, being controllable for said compensations by means of time offsets during the writing.

21. A large-area pattern generator comprising: an exposing system for exposing a substrate with radiant energy and according to input pattern data to impose a predetermined pattern on the substrate, whereby said substrate has a layer being sensitive to said radiant energy;
   a geometry-correcting system for correcting the pattern being imposed in the substrate according to digital distortion data, comprising effectuators for controlling at least one of the feeding of input pattern data in the data path, the movement of the substrate or the pattern placement on the substrate.

22. A pattern generator according to claim 21, wherein the distortion data is generated by measuring a pattern of a previous exposure and detecting deviations relative to the intended pattern as given by the input data.

* * * * *